United States Patent
Bestwick et al.

[11] Patent Number: 6,101,210
[45] Date of Patent: Aug. 8, 2000

[54] EXTERNAL CAVITY LASER

[75] Inventors: Timothy David Bestwick; Jolyon Richard Tidmarsh, both of Oxford; Stephen James Fasham, Beds., all of United Kingdom

[73] Assignee: Bookham Technology PLC, Oxfordshire, United Kingdom

[21] Appl. No.: 09/144,075

[22] Filed: Aug. 31, 1998

[30] Foreign Application Priority Data

Jul. 10, 1998 [GB] United Kingdom ............ 9815070

[51] Int. Cl.$^7$ ............................................. H01S 3/08
[52] U.S. Cl. ............................ 372/96; 372/96; 372/98; 372/101; 350/96
[58] Field of Search ............................ 372/96, 98, 101; 350/96

[56] References Cited

U.S. PATENT DOCUMENTS 4,911,512 3/1990 Yamamoto et al. ............... 350/96.11

*Primary Examiner*—Frank G. Font
*Assistant Examiner*—Delma R. Flores Ruiz
*Attorney, Agent, or Firm*—Fleshner & Kim, LLP

[57] ABSTRACT

External Cavity Laser An external cavity laser comprising first and second feedback means with an optical gain medium (2) therebetween, one of the feedback means is provided by a grating (4) formed in a silicon waveguide and the other feedback means is provided by a reflective back facet (2B) of the optical gain medium (2). The output wavelength of the laser, at a given temperature, can thus be determined during its manufacture and the laser can be made by mass production techniques. The grating (4) may be thermally isolated to obviate the need for temperature control means (6) to control the temperature of the grating (4). An array of lasers may be provided on a single chip.

16 Claims, 3 Drawing Sheets

EXTERNAL CAVITY LASER

FIELD OF INVENTION

This invention relates to external cavity lasers, particularly narrow linewidth lasers for use in telecommunication applications.

BACKGROUND ART

Several methods exist for constructing narrow linewidth single mode semi conductor lasers. Practical devices fall into two groups, monolithic semiconductor devices, and external cavity lasers. All of these use frequency selective feedback to achieve single mode operation over a range of drive currents.

Frequency selective feedback may be provided by a periodic structure either with an external element or within the semiconductor (i.e. monolithic), which can take the form of a DBR (distributed Bragg reflector) or DFB (distributed feedback) laser. In a DBR the grating is outside the active region but in the monolithic semiconductor, whereas the grating in DFB lasers is within the active region. External cavity lasers consist of an optical gain medium that is located between, but does not occupy the full distance between, two reflectors, one reflector commonly being the back facet of the gain medium and the other an external Bragg grating which may be produced in a fibre or waveguide. In previously described devices the external grating is formed either in a single mode fibre, or a Silicon Nitride ($Si_3N_4$) or Silica ($SiO_2$) waveguide.

DFB lasers have a major disadvantage in that, since the output wavelength is a function of both the grating period and the effective refractive index of the device, the output wavelength cannot be accurately controlled from wafer to wafer. Therefore to utilise DFB lasers on a specified frequency, the devices must be sorted by testing and selecting into wavelength ranges and then temperature tuned to attain the desired wavelength. This tuning requirement complicates the temperature stabilisation of the devices, as components such as variable value resistors must be included, making an integrated temperature controller difficult. DBR lasers suffer from similar problems (i.e. changes in effective index and variations in the grating period), with the added difficulty that, due to production tolerances, the relative grating phases of the two Bragg reflectors become unpredictable, resulting in low production yields, or a requirement for a phase adjustment region. In general DBR lasers are more complex and more difficult to manufacture than DFBs.

For use in WDM (wavelength division multiplexing) systems, DFB lasers also require drive-compensating circuits to account for ageing effects which alter the effective refractive index of the device. This also increases the complexity of the control circuit and so may impair long term reliability of the device.

FGLs (fibre grating lasers) are external cavity lasers that essentially consist of a semiconductor laser chip with a reflecting back facet (often HR (high reflection) coated), where lasing is frustrated either by an AR (anti-reflection) coating on the front facet, angled facets/waveguide or a combination of these, coupled to an optical fibre into which a wavelength selective grating is written.

Such gratings are directly written using an UV holographic technique to introduce F-centres (defects) into the fibre in a periodic structure that reflects a selected wavelength. FGLs have the advantage (compared to DFB lasers) that the output wavelength is not determined by the active region and so the wavelength can be accurately pre-determined eliminating the need for sorting and temperature tuning. FGLs also exhibit a smaller wavelength dependence on temperature and so can be operated without temperature compensation over a temperature range of ~30° C. However, to achieve the same operating range as a DFB laser (0° C.–60° C.), a TEC (thermoelectric cooler) is still required.

The major difficulty with FGLs is in manufacture. The grating write process is essentially serial and therefore unsuitable for volume production. In order to achieve good coupling between the active semiconductor and the fibre, it is usually necessary to use a ball lens or lensed fibre for mode matching. This results in a small alignment tolerance between fibre and semiconductor, hence active alignment is required, another process not suited to volume production.

FGLs are also not suitable for single chip integration with other WDM elements, eg MUX (multiplexers) and DMUX (de-multiplexers).

Silica waveguide grating lasers are similar to FGLs but with the grating written into a silica planar waveguide. These suffer from similar manufacturing problems as FGLs, being a serial write process with the additional problem that the output wavelength can not be accurately pre-selected due to the difficulty in controlling the high temperature doping processes required, leading to a requirement for temperature tuning.

DISCLOSURE OF INVENTION

According to a first aspect of the present invention, there is provided an external cavity laser comprising first and second feedback means with an optical gain medium therebetween, one of the feedback means comprising a grating formed in a silicon waveguide.

Preferably, the laser is formed on a silicon chip, the silicon waveguide being a rib waveguide integrated on the chip and the optical gain medium being provided by an optical amplifier mounted on the chip.

The back facet of the optical amplifier preferably forms the other feedback means.

Other features of the invention will be apparent from the description given below and the subsidiary claims of the specification. The invention thus enables integrated optics technology to be used to form a wavelength stabilised external cavity laser, using a reflection amplifier (RA). The RA is coupled to a silicon waveguide grating. The resulting device is an improvement on the prior art such as DBRs or DFBs in that it is possible to reproducibly predetermine the output wavelength of the laser. This removes any need for temperature tuning, resulting in simplified temperature control stabilisation circuitry.

The refractive index of the silicon waveguide is known so the output wavelength of the laser, at a given temperature, can be set in the manufacturing process.

Also, as the grating is separate from the active region of the laser, ageing has no effect on the output wavelength with the result that compensated drive circuits are also not required.

The combination of these factors makes possible a single chip solution to control both temperature stabilisation and laser drive and in addition, the resulting device can be manufactured by mass production techniques, unlike the FGLs and waveguide grating lasers described above. The invention thus provides the advantages of the different prior art devices described above whilst avoiding the disadvantages thereof.

According to a further aspect of the invention there is provided an array of external cavity lasers as described above. Multiplexing means may be provided for combining the outputs of the array of lasers onto a single output. The array of lasers may also use a common optical gain medium and power splitting means to divide the output of the gain medium into a plurality of signals each of which is directed to a different grating.

BRIEF DESCRIPTION OF THE DRAWINGS

The invention will now be further described merely by way of example with reference to the accompanying drawings in which.

BEST MODE OF CARRYING OUT THE INVENTION

Figure 1:
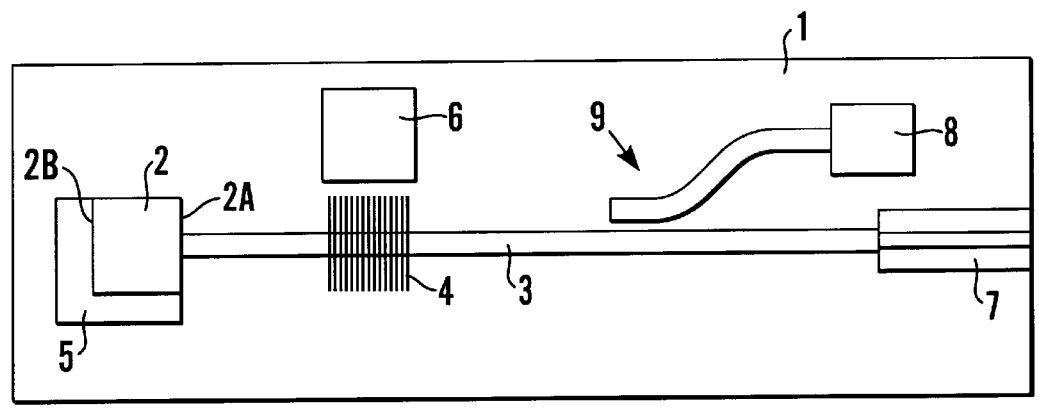
FIG. 1 is a schematic diagram of external cavity laser according to a first embodiment of the invention.

FIG. 1 shows an external cavity laser formed on an SOI chip 1 which comprises an upper, light transmissive layer of silicon separated from a silicon substrate by an insulating layer, typically of silicon dioxide. The device comprises an RA 2, aligned with a silicon waveguide 3 in which a grating 4 is provided.

The RA preferably includes a waveguide therein at an angle to the normal of its front facet 2A. A back facet 2B of the RA is coated with a HR coating and the front facet thereof is AR coated.

The RA 2 is passively aligned on the SOI chip 1 by means of location surfaces of the RA being abutted against location surfaces of a location recess 5 etched in the SOI chip 1. Further details of this method of mounting an optical component are given in U.S. application Ser. No. 08/853,104; the disclosure of which is incorporated herein by reference.

The RA 2 is coupled to the silicon waveguide 3 within which a Bragg grating 4 is formed. The grating 4 effectively forms the front facet of the external cavity laser.

An NTC (negative temperature coefficient) thermistor 6 is located next to the grating 4 to sense the temperature of the grating 4. The thermistor 6 provides an input for a temperature compensation system comprising the thermistor 6, a control circuit (not shown), and a cooling device. The cooling device may comprise a Peltier cooler mounted underneath the chip so as to cool the chip or at least the grating 4 which determines the output wavelength. This temperature compensation system is provided to extend the operating range of the laser (as in an FGL) rather than for tuning the device to compensate for variations in the manufacturing process.

An output fibre 7 is located within an anisotropically etched V-groove in the SOI chip 1 to passively align the fibre to the silicon waveguide 3. A method of coupling a fibre to a rib waveguide on an SOI chip is described in U.S. application Ser. No. 08/643,476 the disclosure of which is incorporated herein by reference. The output of the external cavity laser may also be directed to other optical devices provided on the same chip.

A monitor photodiode 8 is provided to monitor the output of the external cavity laser by means of a waveguide coupler 9 which couples a portion of the laser output into the photodiode 8. The coupler 9 may comprise a Y-junction or an evanescent coupler.

Figure 2:
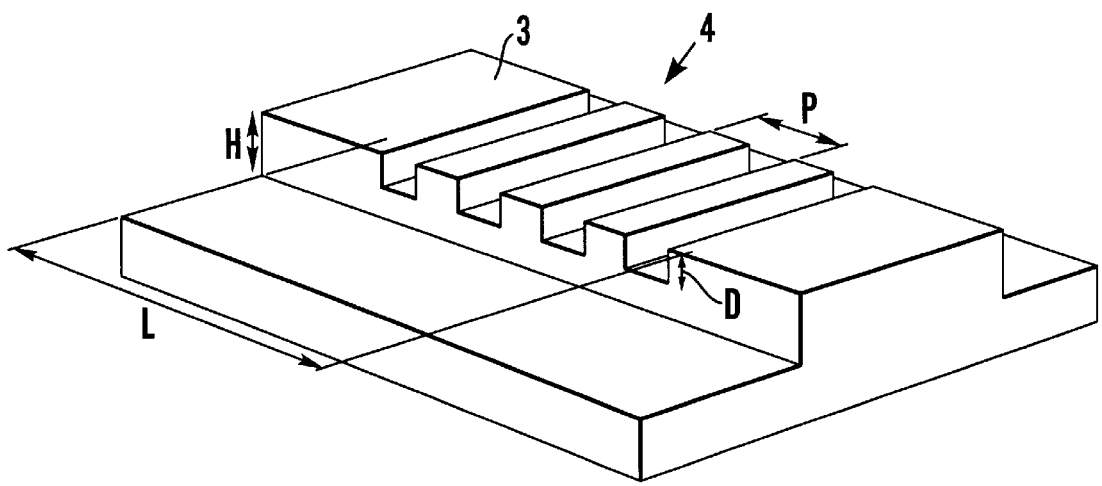
FIG. 2 is a schematic perspective view of a grating formed in a silicon waveguide as used in the laser shown in FIG. 1.

FIG. 2 shows the grating 4 formed in the silicon waveguide 3 in more detail.

The Bragg waveguide grating forms a wavelength selective element and can be produced, for example, by direct electron beam writing onto a photoresist coating formed over the waveguide, the pattern then being etched using RIE (reactive ion etching) to form the grooves of the waveguide grating.

The grooves of the grating preferably extend approximately halfway through the height H of the rib waveguide (whereby H is typically in the range 1.4–5 microns measured from the upper surface of the adjacent areas of the chip). The depth D of the grooves is chosen to optimise the grating coupling, i.e. its reflectivity, the output power of the laser and the optical losses associated with the grating, and preferably D is 30–70% of H.

In a rib waveguide with H being 1.4–1.5 microns, D would thus be in the range 0.4 to 1.1 microns.

The other dimensions of the grating are determined by the wavelength to be selected but a typical grating would have a series of grooves with a 200 nm period P and a 50% mark/space ratio, i.e. each groove is approximately 100 nm wide (in the direction parallel to the optical axis of the waveguide) and spaced 100 nm from the adjacent grooves. The grating would typically extend over a length L of the waveguide of about 1 to 5 mm.

In practice, the grooves of the grating 4 may be filled or partially filled with other material, e.g. silicon dioxide, but the essential requirements of the grating are that it provide periodically alternating regions of different refractive index, so that it reflects a proportion of the selected wavelength, and that it can be formed using mass production techniques.

In another arrangement (not shown), the grating 4 may be formed by grooves in a silicon dioxide cladding layer provided over the waveguide rib in place of, or in addition to, grooves in the silicon rib.

The optical length of the laser cavity, from the back facet 2B of the RA 2 to the effective reflective centre of the grating 4, would typically be of the order of 12 mm. As silicon has a refractive index of 3.5, the physical length of the cavity is thus 12 mm/3.5, i.e. about 3.4 mm.

The fibre to waveguide alignment can also be performed by butt coupling or any other suitable method of achieving good alignment between the waveguide and the fibre core. This includes the use of active monitoring to optimise power output for applications where higher power is a requirement. Active alignment could also be extended to positioning the RA 2, where the added value for higher power devices justifies the increase in production cost and complexity. For such applications, the use of front facet monitoring as described above and a 100% HR coating on the back facet 2B of the RA 2 also enables higher output powers to be achieved.

For applications requiring less power, conventional back facet monitoring may be used in place of the front facet monitoring described above.

Manufacturability of the device may be improved by the use of phase interference masks to produce the waveguide grating. This would enable the grating lithography to be carried out on conventional contact lithography systems with a consequent reduction in production costs, and the possibility for very high volume production.

Other methods such as ion milling could also be used to form the grating 4.

The NTC thermistor 6 is hybridised on the chip adjacent to the grating 4. Other types of hybridised sensor may be used, or a doped structure integrated into the SOI chip may be used. Possible structures include a p-i-n diode or p-n junction, whose properties vary with temperature, provided adjacent or across the waveguide in which the grating is formed. The use of such a monolithic sensor reduces the number of assembly operations required and provides for optimum and repeatable positioning of the temperature sensor.

The waveguide grating 4 may also be provided on a thermally isolated substrate, such as that described in U.S. application Ser. No. 09/057,641 with the grating temperature maintained at a steady temperature by use of a resistive heater and a temperature sensor. This would remove the need for device cooling using a cooling device since it is the temperature of the grating 4 that determines the output wavelength of the laser.

In such an arrangement, the grating is formed on a portion of the silicon waveguide which is substantially thermally isolated from its surroundings. The portion of the waveguide in which the grating is formed, may, for example, be formed on a portion of a silicon layer which extends over a recess in the silicon chip, e.g. in the form of a bridge, or between trenches formed in adjacent areas of the silicon layer. The trenches preferably extend through the silicon layer (which has a relatively high thermal conductivity) down to the insulating layer but may extend through the insulating layer further into the chip. The trenches may be V-grooves formed on either side of the rib waveguide.

Such an arrangement also simplifies the packaging required, since heat sinking may not be required, hence low cost plastics or ceramic packing is possible The combination of these factors results in a large reduction in material costs since the cooling device and packaging usually account for a significant percentage of the total materials cost.

Also, given that resistive heating requires less power than thermoelectric cooling, the use of a thermally isolated grating also make it feasible to integrate of the temperature control circuit into the laser module with consequent system benefits such as reduction in complexity of the drive circuit controlling the device.

Alternatively, the arrangement described above could be used to fine-tune the wavelength of the laser, e.g. to adjust precisely to the. centre of a very narrow WDM band.

Figure 3:
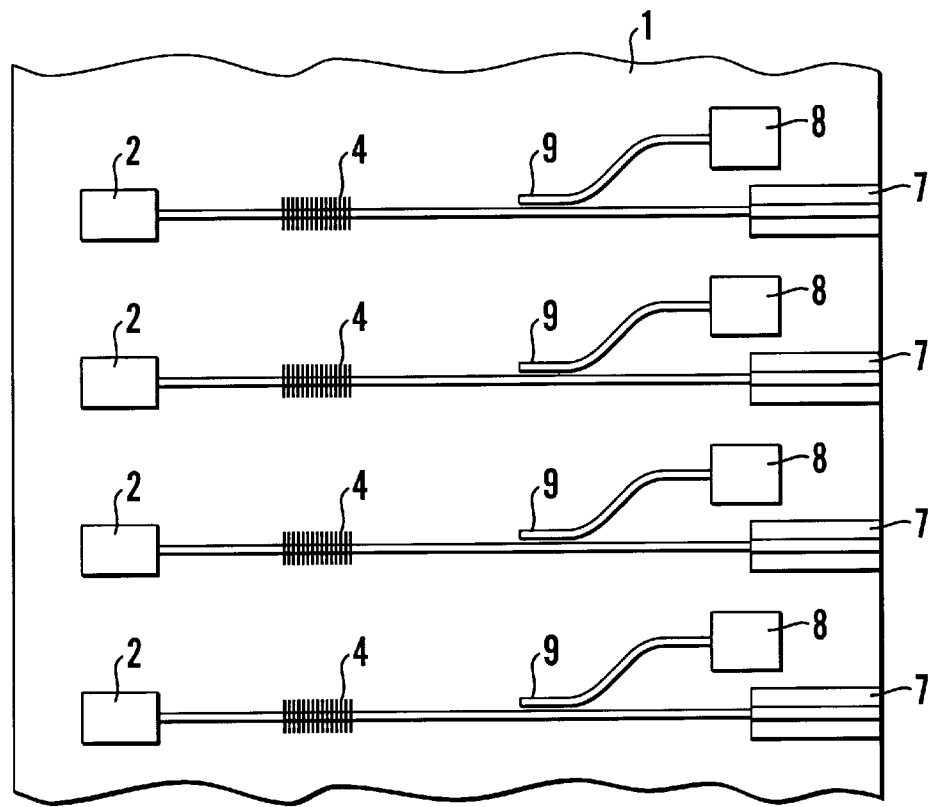
FIG. 3 is a schematic view of an array of external cavity laser such as that shown in FIG. 1 fined on a single chip.

As previously mentioned, SOI technology facilitates integration of devices so making it possible to provide an array of lasers on a single chip as shown in FIG. 3. Each of the lasers shown in FIG. 3 is essentially identical to that described above in relation to FIGS. 1 and 2 but with each grating designed to reflect a different wavelength. SOI technology enables each of the lasers in the array to be formed simultaneously using conventional lithographic techniques. The fibres 7 connected to the array of lasers may be separate optical fibres or part of a fibre ribbon. Alternatively, a multiplexer device 12 may be integrated with the laser array to multiplex the signals from each laser onto a single output waveguide 14 and so produce a single fibre multichannel WDM source.

An external cavity laser or array of such lasers as described above may also be used as part of a transceiver by providing one or more photodiodes on the chip.

Figure 4:
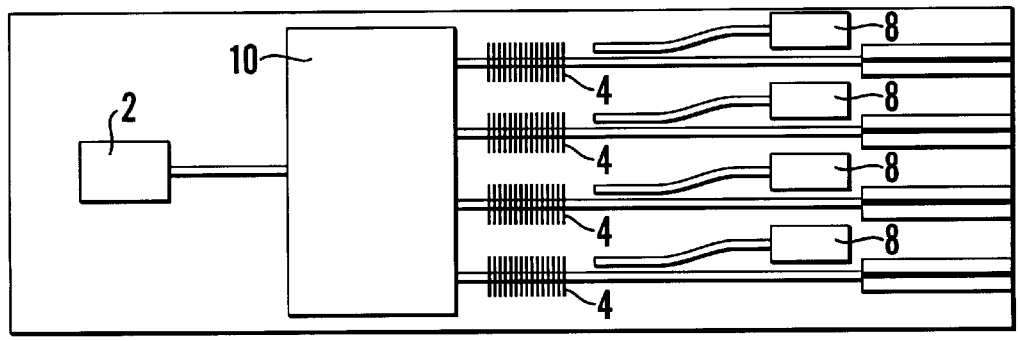
FIG. 4 is a schematic view of an alternative arrangement providing an array of external cavity lasers on a single chip.
Figure 5:
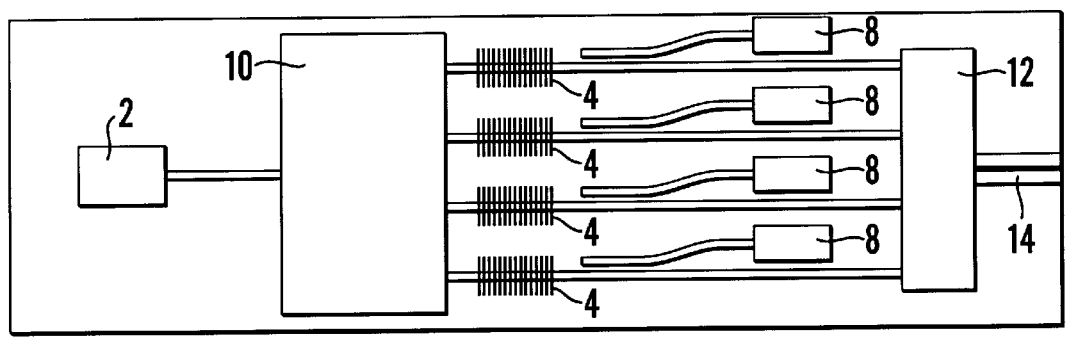
FIG. 5 is a schematic view of another arrangement providing an array of external cavity lasers on a single chip.

FIG. 4 shows an alternative form of array which comprises a single RA 2 connected to a plurality of gratings 4 to produce a multi-channel source with a reduced number of active elements. To achieve this a dispersive power splitting element 10, such as a transmission or reflection grating, or an array of cascaded Y-junctions, is incorporated between the RA 2 and the gratings 4. Such a device will have single mode outputs at each of the Bragg wavelengths of the respective gratings 4.

It will be appreciated that in order to provide the benefits described above, the grating must be written into a silicon waveguide, preferably on an SOI chip. In theory, the device is very similar to a fibre grating laser (or other external cavity laser using a Bragg grating as a feedback element), the significant difference being that the use of integrated silicon optics enables mass production techniques to be employed, as well as the integration of further functions onto a single device with better manageability of the temperature characteristics of the device. The output wavelength of the laser is determined by the grating formed in the silicon waveguide so the output wavelength, at a given temperature, can be determined during manufacture of the device, without the need to tune the device, and all parts of the laser can be made by mass production techniques.

The use of SOI technology leads to significantly reduced production costs compared to the prior art and enables volume production of devices. SOI technology also enables passive alignment of active elements on the device with repeatable and accurate positioning. Further SOI technology allows for additional functionality within a single module, for example the addition of MUX/DMUX and Rx (receiver) elements. The use of SOI waveguides also enables the use of front facet monitoring of the laser using a waveguide coupler to couple a proportion of the output light into a monitor photodiode. This reduces tracking error (the difference between the actual power in the fibre compared to that inferred from the monitor photodiode) and removes the need for back facet monitoring (which is required to provide power monitoring for all devices described by the prior art). This makes possible a more efficient laser since the HR coating on the back facet can be increased to 100% reflection.

What is claimed is:

1. An external cavity laser comprising first and second feedback elements with an optical gain medium therebetween, one of the feedback elements being a grating formed in a silicon waveguide.

2. An external cavity laser as claimed in claim 1 formed on a silicon chip, the silicon waveguide being integrated on the chip and the optical gain medium comprising an optical amplifier mounted on the chip.

3. An external cavity laser as claimed in claim 2 in which the other feedback element comprises a back facet of the optical amplifier.

4. An external cavity laser as claimed in claim 2 in which the optical amplifier is mounted within a location recess formed in the silicon chip.

5. An external cavity laser as claimed in claim 1 in which the silicon waveguide is a waveguide rib and the grating is formed by a series of grooves formed in the waveguide rib.

6. An external cavity laser as claimed in claim 5 in which each of the grooves extends 30 to 70% of the way through the height of the waveguide rib.

7. An external cavity laser as claimed in claim 1 further comprising a temperature sensing element for sensing the temperature of the grating.

8. An external cavity laser as claimed in claim 7 in which the temperature sensing element comprises an integrated sensor formed adjacent or across the waveguide in which the grating is formed, the sensor preferably comprising a p-i-n or p-n junction.

9. An external cavity laser as claimed in claim 7 comprising heating or cooling element for heating or cooling at least the grating.

10. An external cavity laser as claimed in claim 1 in which the grating is formed on a substantially thermally isolated portion of the silicon waveguide.

11. An external cavity laser as claimed in claim 10 formed on a silicon chip in which the portion of the silicon waveguide is formed in a portion of a silicon layer which extends over a recess in the silicon chip.

12. An external cavity laser as claimed in claim 10 formed on a silicon chip in which said portion of the silicon waveguide extends between trenches formed in the adjacent areas of the silicon chip.

13. An external cavity laser as claimed in claim 1, wherein another external cavity laser is provided on the same chip.

14. An external cavity laser as claimed in claim 13, further comprising multiplexing elements for combining the outputs of each external cavity laser.

15. An external cavity laser as claimed in claim 13, further comprising;

a common optical gain medium shared by each external cavity laser; and a power splitting element for dividing the output of the gain medium into a plurality of signals, each of which is directed to a different grating.

16. An external cavity laser as claimed in claim 1 formed on a silicon-on-insulator chip.

* * * * *